United States Patent [19]
Ternes

[11] Patent Number: 5,592,746
[45] Date of Patent: Jan. 14, 1997

[54] IMAGE REGISTRATION BOARD AND COMPRESSIBLE SPACER ASSEMBLY

[75] Inventor: Gretchen Ternes, Shoreview, Minn.

[73] Assignee: Ternes-Burton Company, Saint Paul, Minn.

[21] Appl. No.: 917,456

[22] Filed: Jul. 20, 1992

Related U.S. Application Data

[63] Continuation-in-part of Ser. No. 780,739, Oct. 18, 1991, Pat. No. 5,485,679.

[51] Int. Cl.$^6$ .................................................. G01D 21/00
[52] U.S. Cl. .................................................. 33/623
[58] Field of Search ............................. 33/623, 614, 615, 33/617, 619, 620, 621; 355/32, 75, 79, 88, 95; 101/481

[56] References Cited

U.S. PATENT DOCUMENTS

| | | |
|---|---|---|
| 2,983,049 | 5/1961 | Andrisani . |
| 3,634,009 | 1/1972 | Van Duncan . |
| 4,188,728 | 2/1980 | Denning ........................ 33/623 |
| 4,332,089 | 6/1982 | Denning ........................ 33/623 |
| 4,636,067 | 1/1987 | Richards . |
| 4,855,793 | 8/1989 | Carlson ........................ 355/95 |
| 4,977,683 | 12/1990 | Harder . |
| 4,987,686 | 1/1991 | Ternes . |
| 5,042,165 | 8/1991 | Ternes . |

FOREIGN PATENT DOCUMENTS 535732  1/1957  Canada .

*Primary Examiner*—Thomas B. Will
*Attorney, Agent, or Firm*—Briggs and Morgan

[57] ABSTRACT

A step and repeat apparatus including an image registration board and a compressible spacer. The image registration board preferably comprises a metal primary base layer such as aluminum, a filler layer such as an amorphous polyester including a Kodar® PETG copolyester film extrusion, two lower intermediate layers of polyester film such as Mylar®, two upper intermediate layers of a low molecular weight melanin polymer such as Melanex-T®, an intermediate spacing layer of a closed cell polyethylene or polyurethane foam, and a single top bed layer of an acrylic/PVC thermoplastic sheet such as Uniroyal®DKE400 extrusion grade vinyl, preferably having a top surface defining a level hair-line cell structure. The image registration board preferably defines a plurality of index holes uniformly positioned along and associated with the major divisions of a ruler or scale. The compressible spacer preferably comprises a longitudinal base plate which defines a hollow cylindrical well, a retaining collar received within the well, a retractable post received within the well and extending partially through the retaining collar, a coil-type compression spring to bias the retractable post upwardly away from the base plate, and one or two bottom pins depending from the base plate. The spacer may be mounted on the image board with the bottom pins being engagingly received within a selected pair of corresponding index holes, with the center of the retractable post of the spacer being offset a predetermined distance from each of the centers of the corresponding index holes.

28 Claims, 1 Drawing Sheet

IMAGE REGISTRATION BOARD AND COMPRESSIBLE SPACER ASSEMBLY

This application is a continuation-in-part of application Ser. No. 07/780,739 filed on Oct. 18, 1991, now U.S. Pat. No. 5,485,649. The disclosure contained in that co-pending parent application and the associated file history is incorporated herein by reference as though recited completely, including any continuation-in-part application related thereto.

BACKGROUND OF THE INVENTION

This invention relates generally to image registration boards and spacers of the type used photomechanical plate-making, and particularly to those used in page makeup (stripping) and exposing plates, proofs, or contact prints utilizing a "step-and-repeat" registration system.

U.S. Pat. No. 2,983,049 to Andrisani discloses a system for accurately positioning one or more negatives, flats, screens, plates, or masking sheets, and repositioning those items relative to a fixed reference point (or to one another) in discrete repeating increments. The system comprises a ruled board having evenly spaced index holes aligned along the rulers, and registration pins which may be received within those index holes. This ruled board is commonly referred to as a "step and repeat board," and the current state of the art in construction of step and repeat boards is shown and described in U.S. Pat. No. 4,987,686 to Ternes.

FIGS. 18–27 of Andrisani '049 and FIGS. 4 and 5 of Ternes '686 show the structure of the registration pins in substantially the same form that they are currently used. Each spacer includes a thin metal plate or base that has either one or two bottom pins projecting downwardly and a single top pin projecting upwardly.

Normally, the rulers are divided into integer units with several increments representing common fractions of one unit. The center of each index hole is aligned with an integer unit value on the ruler. A registration pin may have its top pin aligned vertically with one of the bottom pins (or with a single bottom pin), in which case the top pin will be aligned along an major division or integer unit value of the ruler when the bottom pins are inserted into the index holes. Alternately, a registration pin having two bottom pins may have the top pin disposed a predetermined distance or interval between the two bottom pins (and therefore between two corresponding index holes), thus creating an offset for the top pin. Registration pins utilizing such an offset top pin are referred to as "spacers."

The top pins of the spacers are usually offset in increments equal to the minor ruler divisions. For example, if the ruler units were in inches, the spacer offsets would reflect each fraction between zero and one unit in $1/64$", $1/32$", $1/16$", $1/10$", $1/8$" or $1/3$" increments. A conventional step and repeat board could be used with a set having a plurality of several different $1/16$" increment spacers, for example, the spacers in that set typically having offsets of $1/16$", $1/8$", $3/16$", $1/4$", $5/16$", $3/8$", and $1/2$ 41 relative to one of the bottom pins (and therefore a selected index hole.) The orientation of each spacer relative to a particular index hole can be reversed, thus permitting offsets of $9/16$", $5/8$", $11/16$", $3/4$", $13/16$", $7/8$", and $15/16$" from the same set of spacers. The ruler units could be metric, points, picas, or any other convenient and uniform scale.

Currently, the common practice is to space the negative, flat, screen, plate, or masking sheet a short distance away from the ruler and spacer, and apply a paper or thin plastic stripping tab overlapping both the spacer and flat (as shown in FIG. 15 of Andrisani '049 and FIG. 1 of Ternes '686.) The stripping tab has one or more holes to receive the pin of the spacer, and the opposing end is taped or adhered directly to the negative, flat, screen, plate, or masking sheet.

Once the negative, flat, screen, plate, or masking sheet has been aligned or registered as desired using a registration pin or spacer, this particular registration may be accurately reproduced at the same location or anywhere along the ruler (or on a remote board or apparatus having a corresponding line of holes with or without a ruler) using either the same or a distinct set of negatives, flats, plates, screens, or masking sheets and a similar set of registration pins or spacers.

Page makeup may be done on a light table, step and repeat board, or similar layout device, and then subsequently transferred to the platemaker. The platemaker might be a vacuum frame, or an automated step and repeat registration machine. Factors affecting whether a vacuum frame or step and repeat machine is used in platemaking are discussed in the above referenced parent application Ser. No. 07/780,739.

Images (individual negatives or combined flats and any associated screens, plates, or masking sheets) may be transferred to an unruled image control board having spaced registration pins for exposure in a vacuum frame. It is known to provide the image control board with compressible registration pins, or in some cases the vacuum frames may have an integral registration system also including compressible registration pins. Compressible registration pins were similarly discussed in the above referenced parent application Ser. No. 07/780,739, with representative examples of compressible pins on image control boards and vacuum frames being shown in U.S. Pat. Nos. 4,977,683 to Harder and 3,634,009 to Van Dusen. Another alternative has been to equip the image control board or the blanket of the vacuum frame with an elastomeric cushion or substrate that supports the registration pin, and which deforms to simulate compression of the pin. A representative example of such a technique is shown in U.S. Pat. No. 4,636,067 to Richards.

However, the compressible registration pin and step and repeat (or image control) board disclosed therein are not completely suitable for all situations and applications, particularly those wherein a person would prefer or require the utilization of offset spacers to minimize the number of steps or transfers involved in the process of page makeup or the actual platemaking itself.

Some of the various deficiencies of these approaches found in the prior art have been discussed and addressed in the above referenced parent application Ser. No. 07/780,739, which discloses the structure, construction, and use of a compressible registration pin and step and repeat (or image control) board having the particular attributes and advantages disclosed therein.

Compressible spacers fabricated using molded plastic bodies and spring-biased metal posts are known to the art. One representative example of such a compressible spacer is manufactured by Stoesser Industries of Mountain View, Calif., doing business as Stoesser Register Systems. This compressible spacer is limited in that the body of the spacer is light weight and easily displaced from the registration board, if subject to weakening and deformation from high temperatures, can be cracked or broken by the heavy lid of a vacuum frame. In addition, the body defines a bore to receive the retractable post and compressible spring that extends entirely through the body. Consequently, the assembly requires a locking ring, washer, or crimped collar to retain a separate metal disk opposing the bottom of the retractable pin to present a surface from which the compressible spring can bias the retractable post upward, therefore requiring several manufacturing steps to assemble, and which can fail due to the stress of repeated use in normal operating conditions or higher temperature situations where the elasticity of the plastic body increases.

BRIEF SUMMARY OF THE INVENTION

It is therefore one object of this invention to design a compressible spacer and corresponding image registration board for use with that compressible spacer that provide superior capabilities for image registration and transfer.

It is a further object of this invention to design the above compressible spacer and image registration board to achieve to the greatest extent possible the principal functional advantages found in the compressible registration pin and board as discussed in the above referenced parent application Ser. No. 07/780,739.

It is contemplated herein that the terms "image registration board" or "image board" may comprise many different embodiments including those referred to as step and repeat boards, image control boards, or contact boards, although it is contemplated that the preferred embodiment of the compressible spacer of this invention will be utilized with an image registration board having some type of a ruled index and taking advantage of the incremental offsets normally associated with spacers. As such, the terms image registration board or image board should be construed, whenever appropriate, to include any board utilized in the uniform and reproducible layout, page makeup, stripping, and transfer or transportation of negatives, flats, screens, plates, or masking sheets, and the exposure of negative and positive flats or plates in platemakers. The term spacer relates to any pin or post assembly designed to align or hold a flat, screen, or plate in a predetermined or selected position on an image registration board or image board, and may include those having either a null offset, a fixed offset, or an adjustable offset relative to an index hole or similar reference point.

Briefly described, the image board of this invention comprises a metal primary base layer such as aluminum, two lower intermediate layers of polyester film such as Mylar®, two upper intermediate layers of a low molecular weight melanin polymer such as Melanex-T®, a filler layer such as an amorphous polyester including Kodar® PETG copolyester film extrusion, a spacing layer of a closed cell polyethylene or polyurethane foam, and a single top bed layer of an acrylic/PVC thermoplastic sheet such as Uniroyal® DKE400 extrusion grade vinyl, preferably having a top surface defining a level hair-line cell structure. The image board preferably defines a plurality of index holes uniformly positioned along and associated with the major divisions of a ruler or scale.

The compressible spacer of this invention preferably comprises a longitudinal base plate which defines a hollow cylindrical well, a retaining collar received within the well, a retractable post received within the well and extending partially through the retaining collar, a coil-type compression spring to bias the retractable post upwardly away from the base plate, and one or two bottom pins depending from the base plate.

The spacer may be mounted on the image board with the bottom pins being engagingly received within a selected pair of corresponding index holes, with the center of the retractable post of the spacer being offset a predetermined distance from each of the centers of the corresponding index holes.

DESCRIPTION OF THE PREFERRED EMBODIMENTS

The image board 10 and compressible spacer 12 of this invention are shown in FIGS. 1–5 and referenced generally therein. Also disclosed herein is a modified compressible registration pin 14 particularly adapted from the design disclosed and illustrated in parent application Ser. No. 07/780,739 to be utilized with the image board 10 of this invention.

Image Registration Board

Figure 5:
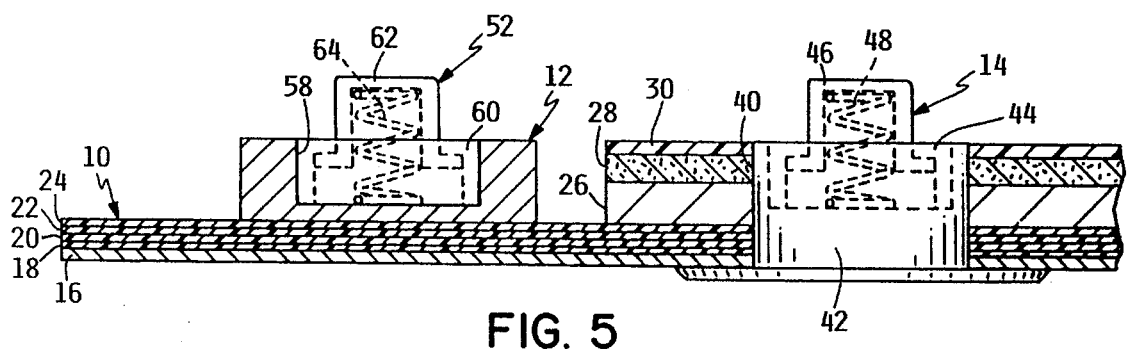
FIG. 5 is a partial cross section view of the compressible spacer, compressible registration pin, and image registration board of FIG. 1 taken through line 5—5 of FIG. 1.

Referring particularly to FIG. 5, it may be seen that the image board 10 includes a generally planar primary base layer 16 of #2024 T6 alclad aluminum having a thickness of 0.025" and a smooth bottom surface, two synthetic polymeric lower intermediate layers 18, 20 of a gray polyester film such as 0.014" thick Du Pont Mylar® adhered to one another and to the top surface of the base layer 16, two synthetic polymeric upper intermediate layers 22, 24 of a white anionic low molecular weight melanin polymer such as 0.014" thick #226 Melanex-T® adhered to one another and to the upper surface of the topmost lower intermediate layer 20, a filler layer 26 of a plastic sheet material including a clear, amorphous polyester such as Kodar® PETG copolyester #6763 film extrusion adhered to the upper surface of the topmost upper intermediate layer 24 and having a thickness of approximately 0.100", a spacing layer 28 of a closed cell polyethylene or polyurethane foam having a thickness of approximately 0.062" adhered to the upper surface of the filler layer 26, and a single synthetic polymeric top bed layer 30 of an acrylic/PVC thermoplastic sheet such as 0.032" thick Uniroyal® DKE400 extrusion grade vinyl, preferably having a top surface defining a level hair-line cell structure of uniformly oriented peaks and intersecting valleys having a depth of approximately 0.003"–0.004". The image board 10 thereby has an overall height or thickness on the order of 0.280" when the layers 18–30 are adhered to one another.

Figure 1:
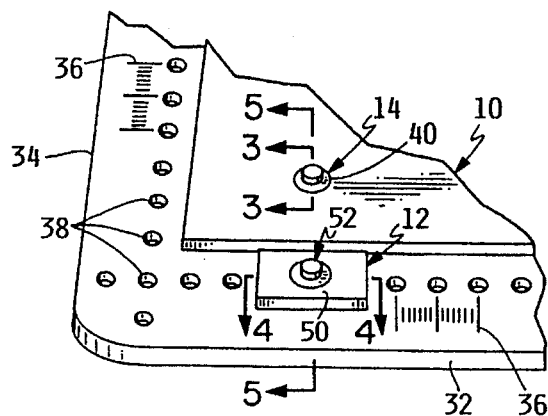
FIG. 1 is a broken away perspective view of a step-and-repeat type registration board exemplary of the image registration board of this invention, with a compressible spacer of this invention mounted in the index holes of a ruler disposed along the edge of the registration board, and a compressible registration pin of this invention mounted in an aperture therein.
Figure 2:
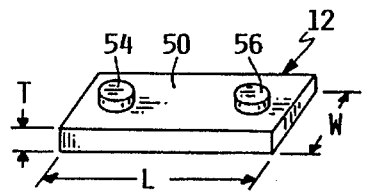
FIG. 2 is a perspective view of the bottom of a compressible spacer of this invention.

Referring to FIGS. 1 and 5, it may be seen that the filler layer 26, spacing layer 28, and top bed layer 30 are inset transversely from the outer peripheral edges 32, 34 of the image board 10, such that the topmost upper intermediate layer 24 defines a border region surrounding the filler layer 26, spacing layer 28, and top bed layer 30 which may be imprinted with a scale or ruler 36. The scale or ruler 36 will preferably be divided into integer units (major ticks) with several increments representing common fractions of one unit (minor ticks). The border defines a plurality of circular indexing holes 38 spaced evenly or equidistantly at predetermined positions or distances along the rulers 36 and having center points aligned with the major ticks or divisions of the rulers 36. The indexing holes 38 extend through both the upper intermediate layers 22, 24 and lower intermediate layers 18, 20, with the diameter of the indexing holes 38 in the lower intermediate layers 18, 20 being slightly greater than the diameter of the corresponding aligned holes 38 in the upper intermediate layers 22, 24 to provide relief when a compressible spacer 12 is mounted therein.

The image board 10 further defines one or more circular apertures 40 extending entirely through each of the layers 18–30 and having a centerline substantially perpendicular thereto, and spaced apart in a predetermined pattern or array on the image board 10. Depending on the particular application, the image board 10 may alternately define a border region having no indexing holes 38 or rulers 36, or omitting the border region or circular apertures 40. In some applications, the spacing layer 28 may be omitted and replaced by a single or composite filler layer 26 having a thickness equal to the combined thicknesses of the individual spacing layer 28 and filler layer 26.

Compressible Registration Pin

Figure 3:
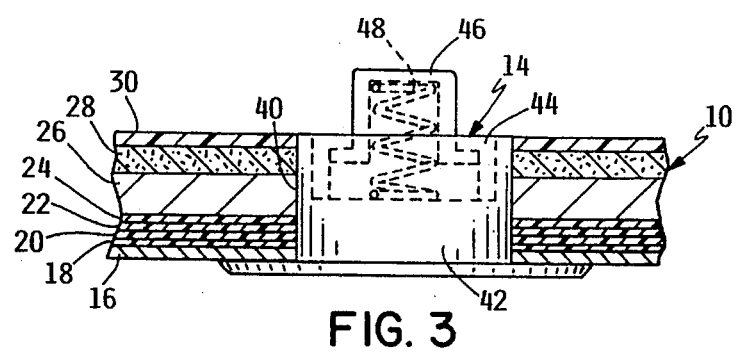
FIG. 3 is a partial cross section view of a compressible registration pin and image registration board of FIG. 1 taken through line 3—3 of FIG. 1.
Figure 4:
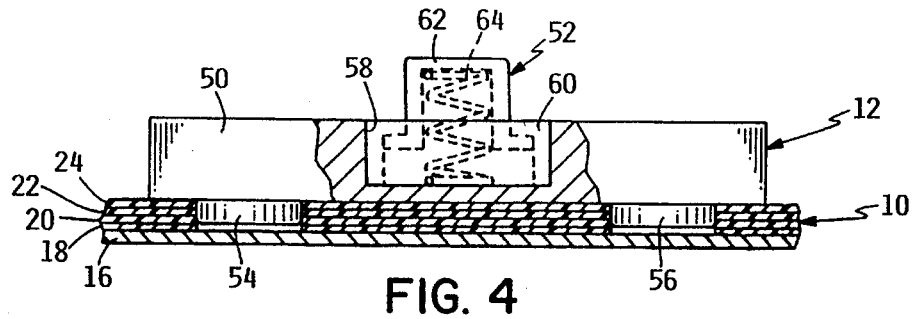
FIG. 4 is a partial cross section view of the compressible spacer and image registration board of FIG. 1 taken through line 4—4 of FIG. 1.

Referring to FIGS. 3 and 5, the compressible registration pin 14 comprises a base cap 42, retaining collar 44, retractable post 46, and coil-type compression spring 48 as generally described in parent application Ser. No. 07/780,739. The compressible registration pin 14 utilized with the image board 10 of this invention is fabricated, assembled, and used in substantially the same manner as described and illustrated therein, with particular adaptations and modifications to that design being set forth below. These adaptations and modifications are not necessarily specific to utilization of the compressible registration pin 14 with the image board 10 of this invention, but may be employed with various other types and designs of image registration boards.

The base cap 42 is preferably fabricated from #2011 T3 aluminum, and defines a hollow upright cylindrical wall having an outer diameter of approximately 0.500" and an inner diameter of approximately 0.438". The cylindrical wall extends upwardly from the top surface of a circular flange member a distance of approximately 0.155" when used with image boards 10 not having a filler layer 26 and spacing layer 28 above the upper intermediate layers 22, 24, and a distance of from 0.287" to 0.315" when used with image boards 10 having a filler layer 26 and spacing layer 28. The base cap 42 defines a cylindrical well having a depth of 0.154" measured from the top edge of the upright cylindrical wall, the well being centered radially in the base cap 42. The flange member has a thickness of 0.020" and extends radially outward from the outer cylindrical surface of the cylindrical wall a distance of 0.188" to form a diameter of approximately 0.875 ".

The retaining collar 44 is preferably fabricated from #360 free machining brass and defines a hollow upright cylindrical wall having a height of 0.150", and outer diameter of 0.439", an inner diameter of 0.342" at the base thereof, and an inner diameter of 0.250" at the top thereof, thus forming an inwardly extending radial lip having a height of 0.025" measured downwardly from the top of the retaining collar 44, and a recessed cavity having a height of 0.125" measured to the bottom surface of the radial lip.

The retractable post 46 is preferably fabricated from 416-5F stainless steel free machining brass, and defines a hollow upright cylindrical wall having an overall height of 0.177", an outer height measured from the top surface of the outwardly extending radial lip of 0.150", an outer diameter of 0.2495" at the top thereof, an inner diameter of 0.158", and an outer diameter of 0.3395" at the bottom thereof, thus forming an outwardly extending radial lip having a height of 0.027" measured upwardly from the bottom of the retractable post 46. The retractable post 46 further has an enclosed top end with an thickness of 0.057", thus forming a recessed cavity having a height of 0.120" measured to the bottom surface enclosed top.

The spring 48 is preferably a coil-type compression spring fabricated from 6 coils of 0.016" diameter steel piano wire having flat ground ends. The spring is wound to an outside diameter of approximately 0.158" or slightly less, so as to be free-fitting within the 0.158" diameter opening of the retractable post 46.

The retractable post 46 is slidably received through the retaining collar 44 with the outwardly extending lip of the retractable post 46 disposed beneath and retained against upward movement by the inwardly extending lip of the retaining collar 44, such that the retractable post 46 is mounted for reciprocal linear movement relative to the base cap 42. The spring 48 is disposed within the base cap 42 generally centered along and circumscribing the common centerline of the base cap 42, retaining collar 44, and retractable post 46. The retaining collar is then forcibly mounted and snugly seated within the base cap 42, thus compressing and trapping the spring 48 within and between the base cap 42 and retractable post 46 such that the spring 48 constantly urges the retractable post 46 upwardly and away from the base cap 42.

In operation, the compressible registration pin 14 is selectively aligned with one of the circular apertures 40 in the image board 10, with the retractable post 46 facing toward the bottom or reverse side surface of the primary base layer 16. The compressible registration pin 14 is slidably inserted into and received within the aperture 40 with the upright cylindrical wall of the base cap 42 contacting each of the layers 16–30 of the image board 10 and being frictionally secured therein to completely mount the compressible registration pin 14 in and to the image board 10 with the flange member of the base cap 42 contacting the bottom surface of the base layer 16 as shown in FIGS. 3 and 5. The compressible registration pin 14 may be selectively and slidably removed from the aperture 38 in the image board 10 by grasping or gripping the circular flange member of the base cap 42 and forcibly withdrawing the compressible registration pin 14 from the aperture 40, or prying the compressible registration pin 14 away from the base layer 16 using a thin instrument inserted between the base layer 16 and flange member of the base cap 42. Alternately, the compressible registration pin 14 may be adhered to the image board 10 in some applications.

As discussed in the parent application Ser. No. 07/780, 739, the retractable post 46 may also have an irregular cross sectional shape when viewed in top plan view, compatible with an irregularly shaped hole punched in the negatives, flats, screens, plates, or masking sheets (not shown), so as to be interchangeable with conventional registration systems having both round or elongated posts and holes.

Compressible Spacer

Referring particularly to FIGS. 1, 2, 4, and 5, it may be seen that the compressible spacer 12 comprises a generally rectangular base plate 50 having a length L of approximately 1.450", a width W of approximately 0.625", and a thickness T of approximately 0.165". The compressible spacer 12 described in detail herein parallels a conventional offset spacer in which the centerpoint of the top pin 52 is disposed at a predetermined location between and along a line joining the centerpoints of a pair of spaced-apart bottom pins 54, 56. Such an embodiment is referred to herein as a fixed offset spacer 12. The compressible spacer 12 of this invention may also constitute an assembly in which the centerpoint of the top pin 52 is parallel and aligned vertically with the centerpoint of one of the bottom pins 54, 56, this embodiment being referred to herein as a null offset spacer 12 or registration tab. Alternately, particularly when fabricating a null offset spacer 12 or registration tab, it may be suitable for the spacer 12 to include only a single bottom pin 54 whose centerpoint is vertically aligned with the centerpoint of the top pin 52.

The compressible spacer 12 has a retractable top pin 52 fabricated as described below projecting upwardly above the top planar surface of the base plate 50 a distance of approximately 0.095" measured from the top planar surface of the base plate 50, and a pair of bottom pins 54, 56 projecting or depending downwardly from the bottom planar surface of the base plate 50 a distance of approximately 0.055" measured from the bottom planar surface of the base plate 50.

The top pin 52 and bottom pins 54, 56 each have a uniform diameter selected from conventional sizes such as approximately 1/8", 3/16", 5/32", 1/4", or 5 mm, with the bottom pins 54, 56 being spaced apart a distance of approximately 1.0" from centerpoint to centerpoint (or the same distance between major ticks of the ruler 36 and the centerpoints of the index holes 38.) The bottom pins 54, 56 are centered between the opposing widthwise edges of the base plate 50, thus providing a space of approximately 0.1875" between the circumferential edge of the bottom pin 54, 56 and the adjacent widthwise peripheral edges of the base plate 50, and a space of approximately 0.10" between the circumferential edge of the bottom pin 54, 56 and the adjacent lengthwise peripheral edges of the base plate 50.

The base plate 50 of the compressible spacer 12 defines a cylindrical well 58 having a diameter of approximately 0.4393", within which are mounted a retaining collar 60, retractable post 62, and coil-type compression spring 64 as generally described above in reference to the compressible registration pin 14. The centerpoints of the cylindrical well 58 and retractable post 62 are centered and aligned along a line extending between the centerpoints of the bottom pins 54, 56, and preferably between the widthwise peripheral edges of the base plate 50.

To construct the compressible spacer 12, the base plate 50 is stamped from a sheet of stainless steel, with the bottom pins 54, 56 being spot welded to one planar surface. The base plate 50 is then polished and etched with the appropriate indicia identifying such information as the relative offset distances of the top pin 52 from each of the bottom pins 54, 56, the size of the top pin 52, and such information as the manufacturer's name and any trademarks. The cylindrical well 58 is then drilled or routed into the top planar surface of the base plate 50 opposing the bottom pins 54, 56. The cylindrical well 58 preferably extends only partially through the base plate 50 or body of the compressible spacer 12 to form a platform on which the compressible spring 64 rests and from which the compressible spring 64 biases the retractable post 62 upward.

In a manner similar to the compressible registration pin 14, the retractable post 62 of the compressible spacer 12 is slidably received through the retaining collar 60 with the outwardly extending lip of the retractable post 62 disposed beneath and retained against upward movement by the inwardly extending lip of the retaining collar 60. The compression spring 64 is placed within the recess of the retractable post 62, and the retaining collar 60 is then forcibly mounted and snugly seated within the cylindrical well 58, thus compressing and trapping the spring 64 within and between the base plate 50 and retractable post 62 such that the spring 64 constantly urges the retractable post 62 upwardly and away from the base plate 50.

In operation, each of the bottom pins 54, 56 of the compressible spacer 12 are selectively aligned with and received within a corresponding pair of the circular index holes 38 in the image board 10, with the compressible spacer 12 being pressed downwardly to ensure secure frictional engagement between the compressible spacer 12 and image board 10.

Referring particularly to FIG. 5, it may be seen that when the compressible spacer 12 is mounted in the index holes 38 within the border region surrounding the raised filler layer 26, spacing layer 28, and top bed layer 30, the top planar surface of the base plate 50 of the compressible spacer 12 lies substantially coplanar with or slightly below the height of the top planar surface of the top bed layer 30. This top planar surface of the top bed layer 30 thereby defines a raised image layout area or region surrounded by the border region (or having a border region disposed on one or more sides thereof.) The height of the top surface of the retractable post 62 of a compressible spacer 12 would similarly be substantially coplanar to or slightly below the height of the top surface of the retractable post 46 of a compressible registration pin 14 mounted within an aperture 40 disposed within the raised image layout area of the image board 10.

The offset distances between the centerpoint of the top pin 52 of a compressible spacer 12 and the associated bottom pins 54, 56 and index holes 38 would normally reflect a predetermined fractional increment between zero and one unit as measured using the units of the scale or ruler 36 applied to the border of the image board 10. A conventional step and repeat board 10 with a ruler 36 in units of inches (with major ticks at one inch intervals) would be used for example with a conventional set of compressible spacers 12 typically having a range of discrete offsets including 1/32", 1/16", 3/32", 1/8", 5/32", 3/16", 7/32", 1/4", 9/32", 5/16", 11/32", 3/8", 13/32" 7/16", and 1/2" relative to one of the bottom pins 54, 56 (an a selected index hole 38.) Each set of compressible spacers 12 would include a plurality of each spacer 12 having one of the designated offsets. The orientation of each compressible spacer 12 relative to a particular index hole 38 can be reversed, thus permitting offsets between 1/2" and 31/32" in 1/32" increments.

One or more images (including one or more negatives, flats, plates, screens, or masking sheets, not shown) are placed on the raised layout area with an edge disposed a short distance away from the ruler 36 and one or more compressible spacers 12, and a paper or thin plastic stripping tab (not shown) having one or more holes corresponding to the shape and size of the top pin 52 of the compressible spacer 12 are applied overlapping both the top pin 52 of the compressible spacer 12 and the image. The stripping tab is then taped directly to the image. Conversely, the images themselves may also be punched directly with a hole corresponding to the size and shape of the top pin 52 of the compressible spacer 12.

Once the image has been aligned or registered as desired using one or more compressible spacers 12 or compressible registration pins 14, that particular registration may be accurately reproduced at the same location or anywhere else along the ruler 36 (or on a remote image registration board 10 or apparatus having a corresponding ruler 36) using either the same or a distinct series of images and a similar set of compressible spacers 12 and compressible registration pins 14..

The compressible spacer 12 may be selectively and slidably removed from the index holes 38 of the image board 10 by grasping or gripping the opposing lengthwise or widthwise peripheral edges of the base plate 50 and forcibly lifting the compressible spacer 12 away from the image board 10 to withdraw the bottom pins 54, 56 from the corresponding index holes 38, or by prying the compressible spacer 12 array from the image board 10 using a thin instrument inserted between the base plate 50 and the top surface of the topmost upper intermediate layer 24.

It is understood that the retractable post 62 of the compressible spacer 12 may also have an irregular cross sectional shape when viewed in top plan view, compatible with an irregularly shaped hole punched in the stripping tab or images, so as to be interchangeable with conventional registration systems having both round or elongated posts and holes.

The compressible spacer 12 may alternately be fabricated by drilling apertures entirely through the base plate 50 to receive cylindrical rods or posts therein which extend or project from the bottom surface of the base plate 50 to form the bottom pins 54, 56, however it has been found that when the cylindrical well 58 is subsequently drilled or routed close to or overlapping the cylindrical rods or posts, the rods or posts will rotate within the apertures and produce an irregular or defective result.

While the preferred embodiments of the above image board 10, compressible spacer 12, and associated modifications to the compressible registration pin 14, have been described in detail with reference to the attached drawing FIGURES, it is understood that various changes and adaptations may be made in the image board 10 and compressible spacer 12 without departing from the spirit and scope of the appended claims.

In addition, the particular materials and brands referenced herein and incorporated within the claims relating to the layers 18–30 are intended as representing suitable and preferred embodiments, but are not an exhaustive recitation of all materials or brands that may function in substantially the same manner to achieve substantially the same result. Consequently, it is understood that various materials having similar properties and functioning in substantially the same manner as those recited may be substituted for those recited to achieve substantially the same result, would be encompassed by the claims as appended.

What is claimed is:

1. An image board and compressible spacer assembly for use in maintaining the registration of one or more negatives, a flats, or plates during layout, stripping, transfer, or in a platemaker, said negative said flat, or said plate having at least one registration hole associated therewith, said image board and compressible spacer assembly comprising:

an image board having at least one base layer, at least one intermediate layer connected to and disposed above said at least one base layer, and a bed layer connected to and disposed above said at least one intermediate layer, said bed layer having a top surface defining an image layout area, said image board further defining a border region adjacent said image layout area and a ruler disposed proximate to said border region, said image board defining a plurality of indexing holes spaced apart generally equidistantly at predetermined positions along said ruler proximate to said border region; and a compressible spacer having a body, a post, and a spring member, said body defining a well extending partially through said body such that said body defines a platform from which said spring member biases said post upwardly to an extended position, said post being mounted for reciprocal movement relative to said body between said extended position and a retracted position, said body including at least one bottom pin depending from said body for selectively and removably mounting said compressible spacer within at least one of said plurality of indexing holes, at least a portion of said post initially extending above said top surface of said bed layer when said compressible spacer is mounted on said image board such that the one or more negatives, flats, or plates are disposed on said image layout area with the registration hole receiving said portion of said post therethrough when said post is in said extended position, said post being movable to said retracted position in response to pressure being exerted downwardly on said post.

2. The image board and compressible spacer assembly of claim 1 wherein a plurality of the one or more negatives, flats, or plates may be placed on the post for registration, said plurality having a thickness substantially equal to the portion of the post initially extending above the top surface of the bed layer when the post is in the extended position, and further wherein the post will not move to the retracted position in response to the weight of said plurality being placed thereon with the registration holes thereof not aligned with the post.

3. The image board and compressible spacer assembly of claim 1 wherein the image board further comprises a filler layer, said filler layer being disposed above the at least one intermediate layer.

4. The image board and compressible spacer assembly of claim 3 wherein the filler layer has a thickness on the order of 0.1".

5. The image board and compressible spacer assembly of claim 3 wherein the filler layer is fabricated from a plastic sheet material.

6. The image board and compressible spacer assembly of claim 5 wherein the filler layer is fabricated from a clear, amorphous polyester.

7. The image board of claim 6 wherein the filler layer is fabricated from Kodar® PETG copolyester #6763 film extrusion.

8. The image board and compressible spacer assembly of claim 1 wherein the image board further comprises a spacer layer, said spacer layer being disposed above the at least one intermediate layer.

9. The image board and compressible spacer assembly of claim 8 wherein the spacer layer has a thickness on the order of 0.6".

10. The image board and compressible spacer assembly of claim 8 wherein the spacer layer is fabricated from a closed cell polyethylene or polyurethane foam material.

11. The image board and compressible spacer assembly of claim 1 wherein the image board further comprises a filler layer and a spacer layer, said filler layer and said spacer layer each being disposed above the at least one intermediate layer.

12. The image board and compressible spacer assembly of claim 11 wherein the spacer layer is disposed above the filler layer and beneath the bed layer.

13. The image board and compressible spacer assembly of claim 1 wherein the post has a bottom end and includes an outwardly extending radial lip proximate to said bottom end thereof, and wherein the body of the compressible spacer assembly comprises:

a retaining collar received and secured within the well, said retaining collar having a top end and a bore extending therethrough, said retaining collar defining an inwardly extending radial lip proximate to said bore, whereby the post is received through the bore of the retaining collar such that the outwardly extending radial lip of the post is disposed beneath the inwardly extending radial lip of the retaining collar, the inwardly extending radial lip of the retaining collar preventing the outwardly extending radial lip of the post from passing entirely through the bore so as to retain the bottom end of the post within the well of the body.

14. The image board and compressible spacer assembly of claim 13 wherein the retaining collar is fabricated from brass.

15. The image board and compressible spacer assembly of claim 1 wherein the body of the compressible spacer is fabricated from stainless steel.

16. The image board and compressible pin assembly of claim 1 wherein the spring member is a coil-type compression spring.

17. The image board and compressible spacer assembly of claim 1 wherein the post of the compressible spacer is fabricated from stainless steel.

18. The image board and compressible spacer assembly of claim 1 wherein the image board has a thickness on the order of 0.28" or less.

19. The image board and compressible spacer assembly of claim 1 wherein the number of the at least one bottom pin depending from the body for selectively and removably mounting the compressible spacer within the at least one of the plurality of indexing holes is two.

20. The image board and compressible spacer assembly of claim 1 wherein the post has a vertical centerline and wherein the at least one bottom pin has a vertical centerline, said vertical centerline of the post being offset a predetermined distance from said vertical centerline of the at least one bottom pin.

21. A compressible spacer for use in association with an image board for maintaining the registration of one or more negatives, flats, or plates during layout, stripping, transfer, or in a platemaker, said one or more negatives, flats, or plates having at least one registration hole associated therewith, said image board having at least one base layer, at least one intermediate layer, and a bed layer having a top surface defining an image layout area, said image board further defining a border region adjacent said image layout area and a ruler disposed proximate to said border region, said image board defining a plurality of indexing holes spaced apart generally equidistantly at predetermined positions along said ruler proximate to said border region, said compressible spacer comprising:

a body;

a post; and a spring member, said body defining a well extending partially through said body such that said body defines a platform from which said spring member biases said post upwardly to an extended position, said post being mounted for reciprocal movement relative to said body between said extended position and a retracted position, said body including at least one bottom pin depending from said body for selectively and removably mounting the compressible spacer within at least one of the plurality of indexing holes, at least a portion of said post initially extending above the top surface of the bed layer when the compressible spacer is mounted on the image board such that the one or more negatives, flats, or plates are disposed on the image layout area with the registration hole receiving said portion of said post therethrough when said post is in said extended position, said post being movable to said retracted position in response to pressure being exerted downwardly on said post.

22. An image board for use in association with a spacer for maintaining the registration of one or more negatives, flats or plates during layout, stripping, transfer, or in a platemaker, said one or more negatives, flats or plates having at least one registration hole associated therewith, said spacer having a body, a post extending upwardly from said body, and at least one bottom pin depending from said body, said image board comprising:

a base layer;

a plurality of intermediate layers disposed above said base layer;

a filler layer disposed above said plurality of intermediate layers;

a spacer layer disposed above said plurality of intermediate layers; and a bed layer disposed above said filler layer and said spacer layer, said bed layer having a top surface defining an image layout area, said image board further defining a border region adjacent said image layout area and a ruler disposed proximate to said border region, said image board defining a plurality of indexing holes spaced apart generally equidistantly at predetermined positions along said ruler proximate to said border region, whereby the at least one bottom pin of the spacer may be selectively and removably mounted within at least one of the plurality of indexing holes, with at least a portion of the post extending above the top surface of the bed layer such that the one or more negatives, flats or plates disposed on the image layout area with the registration hole receiving the portion of the post therethrough.

23. The image board of claim 22 wherein the filler layer is fabricated from a clear, amorphous polyester.

24. The image board of claim 22 wherein the filler layer has a thickness on the order of 0.1".

25. The image board of claim 22 wherein the spacer layer is fabricated from a closed cell polyethylene or polyurethane foam material.

26. The image board of claim 22 wherein the spacer layer has a thickness on the order of 0.6".

27. The image board of claim 22 wherein the spacer layer is disposed above the filler layer and beneath the bed layer.

28. The image board of claim 23 wherein the filler layer is fabricated from Kodar® PETG copolyester #6763 film extrusion.

* * * * *